(12) United States Patent
Ghosh et al.

(10) Patent No.: US 11,735,247 B2
(45) Date of Patent: *Aug. 22, 2023

(54) SEMICONDUCTOR DEVICE WITH WORD LINE DEGRADATION MONITOR AND ASSOCIATED METHODS AND SYSTEMS

(71) Applicant: Micron Technology, Inc., Boise, ID (US)

(72) Inventors: Gitanjali T. Ghosh, Boise, ID (US); Debra M. Bell, Boise, ID (US); Arunmozhi R. Subramaniam, Boise, ID (US); Roya Baghi, Boise, ID (US); Deepika Thumsi Umesh, Boise, ID (US); Sue-Fern Ng, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/672,537

(22) Filed: Feb. 15, 2022

(65) Prior Publication Data

US 2022/0172768 A1 Jun. 2, 2022

Related U.S. Application Data

(63) Continuation of application No. 17/022,030, filed on Sep. 15, 2020, now Pat. No. 11,270,757.

(60) Provisional application No. 62/955,822, filed on Dec. 31, 2019.

(51) Int. Cl.
*G11C 11/408* (2006.01)
*G11C 11/4099* (2006.01)
*G11C 11/4076* (2006.01)
*G11C 11/4074* (2006.01)

(52) U.S. Cl.
CPC ...... *G11C 11/4085* (2013.01); *G11C 11/4074* (2013.01); *G11C 11/4076* (2013.01); *G11C 11/4099* (2013.01)

(58) Field of Classification Search
CPC .................................................. G11C 11/5628
See application file for complete search history.

(56) References Cited

U.S. PATENT DOCUMENTS

| 6,680,874 | B1 | 1/2004 | Harrison |
| 10,141,034 | B1 | 11/2018 | Zitlaw |
| 11,270,757 | B2 * | 3/2022 | Ghosh ............... G11C 29/52 |

(Continued)

*Primary Examiner* — Douglas King
(74) *Attorney, Agent, or Firm* — Perkins Coie LLP (57) ABSTRACT

Memory devices, systems including memory devices, and methods of operating memory devices are described, in which memory devices are configured to monitor degradations in word line characteristics. The memory device may generate a reference signal in response to an access command directed to a memory array including a plurality of word lines, in some embodiments. The memory array may include a victim word line configured to accumulate adverse effects of executing multiple access commands at the word lines of the memory array. When the degradation in the word line characteristics causes reliability issues (e.g., corrupted data), the memory array is deemed unreliable, and may be blocked from memory operations. The memory device may compare the reference signal and a signal from the victim word line to determine whether preventive measures may be appropriate to avoid (or mitigate) such reliability issues.

20 Claims, 5 Drawing Sheets

(56) References Cited

U.S. PATENT DOCUMENTS

| | | |
|---|---|---|
| 2006/0203948 A1 | 9/2006 | Lin |
| 2006/0267636 A1 | 11/2006 | Lin |
| 2008/0309364 A1 | 12/2008 | Joshi et al. |
| 2018/0144793 A1 | 5/2018 | Jo |
| 2021/0201981 A1 | 7/2021 | Ghosh et al. |

* cited by examiner

SEMICONDUCTOR DEVICE WITH WORD LINE DEGRADATION MONITOR AND ASSOCIATED METHODS AND SYSTEMS

CROSS-REFERENCE TO RELATED APPLICATION

This application is a continuation of U.S. patent application Ser. No. 17/022,030, filed Sep. 15, 2020, now U.S. Pat. No. 11,270,757; which application claims the benefit of U.S. Provisional Application No. 62/955,822, filed Dec. 31, 2019; which is incorporated herein by reference in its entirety.

TECHNICAL FIELD

The present disclosure generally relates to semiconductor devices, and more particularly relates to a semiconductor device with a word line degradation monitor and associated methods and systems.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and nonvolatile memory. Volatile memory, including random-access memory (RAM), static random-access memory (SRAM), dynamic random-access memory (DRAM), and synchronous dynamic random-access memory (SDRAM), among others, require a source of applied power to maintain its data. Nonvolatile memory, by contrast, can retain its stored data even when not externally powered. Nonvolatile memory is available in a wide variety of technologies, including flash memory (e.g., NAND and NOR), phase change memory (PCM), ferroelectric random-access memory (FeRAM), resistive random-access memory (RRAM), and magnetic random-access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

As memory cells scale to increase memory densities and storage capacities of memory devices, meeting various reliability criteria for the memory devices becomes ever more challenging. Further, as the memory devices are utilized in emerging areas of applications (e.g., data center applications, 5G and/or internet-of-things (IOT) applications, automotive applications), the reliability criteria may become more stringent when compared to conventional areas of applications (e.g., a compute environment). For example, memory devices in automotive applications (e.g., infotainment systems, advanced driver-assistance systems (ADAS), autonomous driving systems) may be required to continuously process data being generated at a rate greater than 1 giga-byte per second. Also, the memory devices may be required to operate in extreme temperatures (e.g., higher and/or lower temperatures than the compute environment) while providing extended longevities once implemented in vehicles (e.g., ten (10) or more years of life time). In some cases, various safety requirements associated with the automotive applications (e.g., intelligent brake control systems, steering wheel control systems) may demand highly strict reliability criteria for the memory devices.

Memory devices typically include various semiconductor switching components (e.g., metal-oxide-semiconductor field-effect transistors (MOSFETs), bipolar junction transistors (BJTs), diodes) in many different circuits performing various functions to support the memory devices. In some cases, channel hot carriers (CHCs) of MOSFETs (e.g., n-type MOSFETs) may increase threshold voltage ($V_T$) of the MOSFETs after operating in a saturation conduction mode for a certain duration, which in return, reduce drive currents ($I_{DS}$) that the MOSFETs generate. Such reductions in $I_{DS}$ may degrade performance characteristics of the circuits that include the MOSFETs.

For example, when MOSFETs are used in a word line driver circuit (which may be referred to as a WL driver) controlling a voltage of the word line during memory operations, a reduction in $I_{DS}$ of the MOSFETs (e.g., due to the CHC increasing $V_T$ of the MOSFETs) may increase time for the word line transitioning from an ON state to an OFF state. The ON state may refer to the word line having a voltage approximately equal to an operating voltage (e.g., 1 V) of the memory device, and the OFF state to the word line having a voltage approximately equal to a ground level (e.g., 0 V). In some cases, it may take longer than a specified time span for the WL driver to bring the word line from the ON state to the OFF state. When a word line fails to establish the OFF state within the specified time span (which may be referred to as "drifting" of the word line), subsequent access to the memory may become unreliable, resulting in corrupted data.

Several embodiments of the present technology are directed to monitoring degradations in switching characteristics related to word line of a memory array—e.g., due to the CHC mechanism deteriorating MOSFETs in WL drivers coupled to the word lines. The present technology may be utilized to detect the degradations of word line switching characteristics such that memory devices prone to suffer from reliability issues (or memory devices expected to have difficulties in meeting reliability criteria, e.g., due to drifting of the word lines) at an early stage such that preventive measures may be implemented to avoid corrupting data during memory operations—e.g., retiring at least a portion of the memory devices, notifying a host device of the memory devices that are likely to experience the reliability issues. Further, the present technology may facilitate identification of root cause(s) of various degradation mechanism rendering the memory device unreliable—e.g., the CHC mechanism deteriorating n-channel MOSFETs in WL drivers, among others.

A memory device that supports embodiments of the present technology is described with reference to FIG. 1. Timing diagrams are described in FIG. 2 to illustrate monitoring of a word line degradation in accordance with embodiments of the present technology. More detailed descriptions of a word line degradation monitor for a memory device in accordance with embodiments of the present technology are provided with reference to FIG. 3. A memory system including a memory device configured to support a word line degradation monitor in accordance with embodiments of the present technology is described with reference to FIG. 4. A method of operating the memory device for a word line degradation monitor in accordance with embodiments of the present technology is described with reference to FIG. 5.

Figure 1:
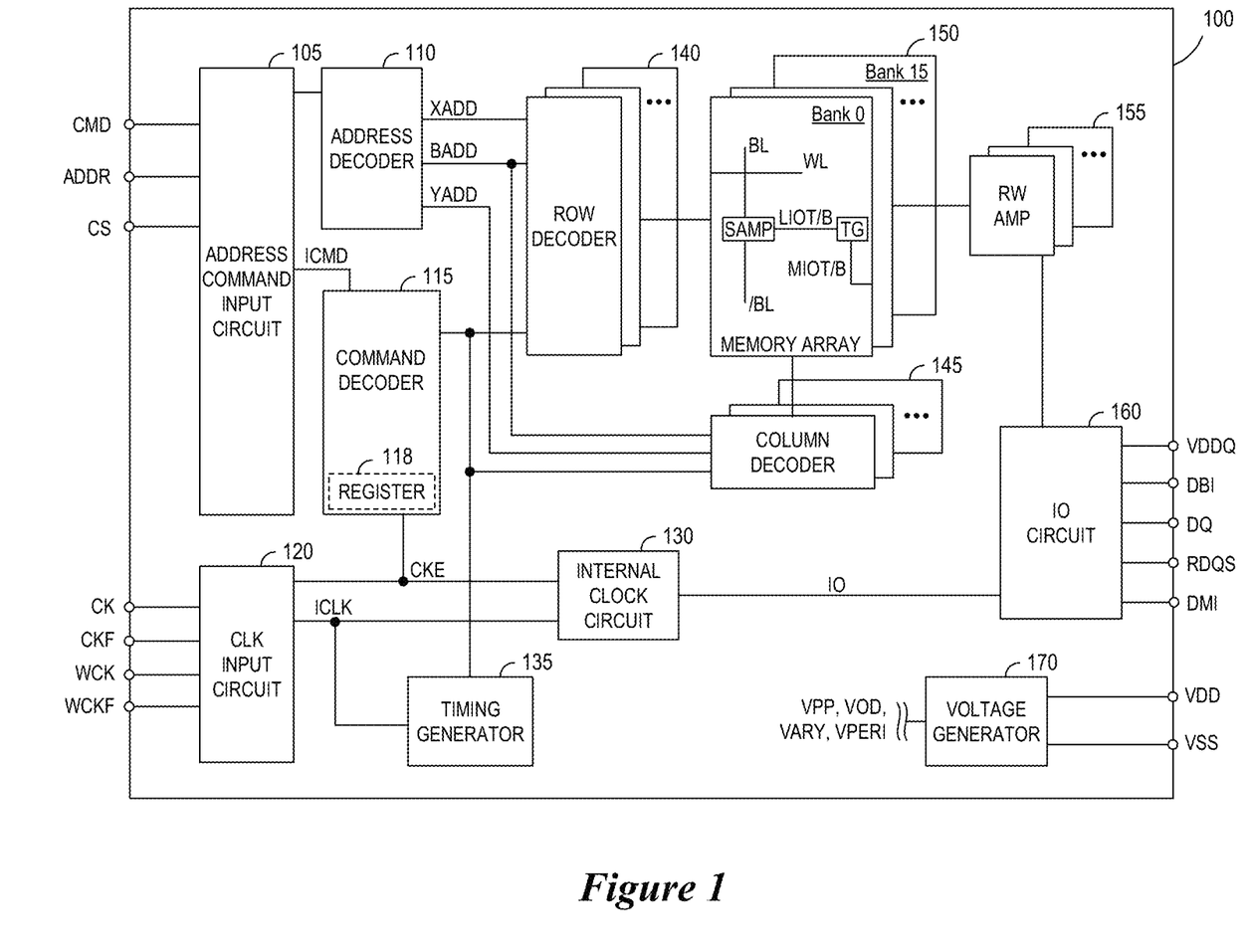
FIG. 1 is a block diagram schematically illustrating a memory device in accordance with embodiments of the present technology.

FIG. 1 is a block diagram schematically illustrating a memory device 100 in accordance with embodiments of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells (e.g., m×n memory cells) arranged at intersections of the word lines (e.g., m word lines, which may also be referred to as rows) and the bit lines (e.g., n bit lines, which may also be referred to as columns). Each word line of the plurality may be coupled with a corresponding word line driver (WL driver) configured to control a voltage of the word line during memory operations.

In some embodiments, the plurality of word lines may include a victim word line (which may be variously referred to as a dummy word line or a test word line) that is devised (e.g., identified, designated, or otherwise set aside) to accumulate adverse effects to the WL drivers when accessing the word lines. For example, the memory device 100 may be configured to activate (e.g., operate) a WL driver (e.g., a first victim WL driver) coupled to the victim word line whenever the memory device 100 accesses a word line of the plurality (i.e., any word line other than the victim word line)—e.g., by activating a corresponding WL driver. In this manner, the victim WL driver coupled to the victim word line may be activated more often than the other WL drivers, and may experience accelerated degradation—e.g., a reduced $I_{DS}$ of a MOSFET included in the WL driver due to the CHC mechanism over an extended period of time. Additionally, or alternatively, the memory device may include a second victim WL driver coupled to a resistance-capacitance (RC) component that is configured to model (e.g., emulate, simulate) a distributed RC network of a true word line.

Memory cells can include any one of a number of different memory media types, including capacitive, phase change, magnetoresistive, ferroelectric, or the like. In some embodiments, a portion of the memory array 150 may be configured to store ECC parity bits. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least one respective main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI (for data bus inversion function), and DMI (for data mask inversion function), power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140 (which may be referred to as a row driver), and a decoded column address signal (YADD) to the column decoder 145 (which may be referred to as a column driver). The address decoder 110 can also receive the bank address portion of the ADDR input and supply the decoded bank address signal (BADD) and supply the bank address signal to both the row decoder 140 and the column decoder 145.

The command and address terminals may be supplied with command signals CMD, address signals ADDR, and chip select signals CS, from a memory controller. The command signals may represent various memory commands from the memory controller (e.g., refresh commands, activate commands, precharge commands, access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105.

The command decoder 115 may include circuits to decode the internal command signals ICMD to generate various internal signals and commands for performing memory operations, for example, a row command signal to select a word line and a column command signal to select a bit line. Other examples of memory operations that the memory device 100 may perform based on decoding the internal command signals ICMD includes a refresh command (e.g., re-establishing full charges stored in individual memory cells of the memory array 150), an activate command (e.g., activating a row in a particular bank, in some cases for subsequent access operations), or a precharge command (e.g., deactivating the activated row in the particular bank). The internal command signals can also include output and input activation commands, such as clocked command CMDCK (not shown in FIG. 1).

The command decoder 115, in some embodiments, may further include one or more registers 118 for tracking various counts and/or values (e.g., counts of refresh commands received by the memory device 100 or self-refresh operations performed by the memory device 100) and/or for storing various operating conditions for the memory device 100 to perform certain functions, features, and modes (or test modes). As such, in some embodiments, the registers 118 (or a subset of the registers 118) may be referred to as mode registers. Additionally, or alternatively, the memory device 100 may include registers 118 as a separate component out of the command decoder 115. In some embodiments, the registers 118 may include multi-purpose registers (MPRs) configured to write and/or read specialized data to and/or from the memory device 100. For example, the memory device 100 may determine that the victim word line of the bank 2 of the memory array 150 is degraded beyond a threshold as described in more detail with reference to FIGS. 2 and 3. Subsequently, the memory device 100 may store an indication of such determination in the registers 118. In some cases, the memory device 100 may assert an alert pin configured to transmit a signal indicative of the determination to a host device such that the host device may perform one or more appropriate operations (e.g., retiring the memory device 100, routing address signals (e.g., BADD) directed to the bank 2 to other banks (e.g., bank 1, bank 3, etc.) of the memory device 100).

In some embodiments, the memory device 100 may include a reference component (e.g., a reference component 350 described with reference to FIG. 3) configured to generate a reference signal in response to a command (e.g., precharge command) directed to the memory array 150. Further, the memory device 100 may include a comparison circuit (e.g., a comparison circuit 365 described with reference to FIG. 3) configured to monitor the reference signal, and a first signal associated with the command executed at the victim word line (e.g., operating the first victim WL driver coupled to a victim word line) and/or a second signal derived from the second victim WL driver coupled to the RC component described herein (e.g., operating the second victim WL driver coupled to the RC component). The comparison circuit 365 may be further configured to detect a first transition in the first and/or second signals and a second transition in the reference signal, and to determine whether the first transitions in the first and/or second signals occur before or after the second transition in the reference signal.

When a read command is issued to a bank with an open row and a column address is timely supplied as part of the read command, read data can be read from memory cells in the memory array 150 designated by the row address (which may have been provided as part of the activate command identifying the open row) and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (e.g., the register 118). The read latency information RL can be defined in terms of clock cycles of the CK clock signal. For example, the read latency information RL can be a number of clock cycles of the CK signal after the read command is received by the memory device 100 when the associated read data is provided.

When a write command is issued to a bank with an open row and a column address is timely supplied as part of the write command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (e.g., register 118). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command decoder 115. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

Figure 2:
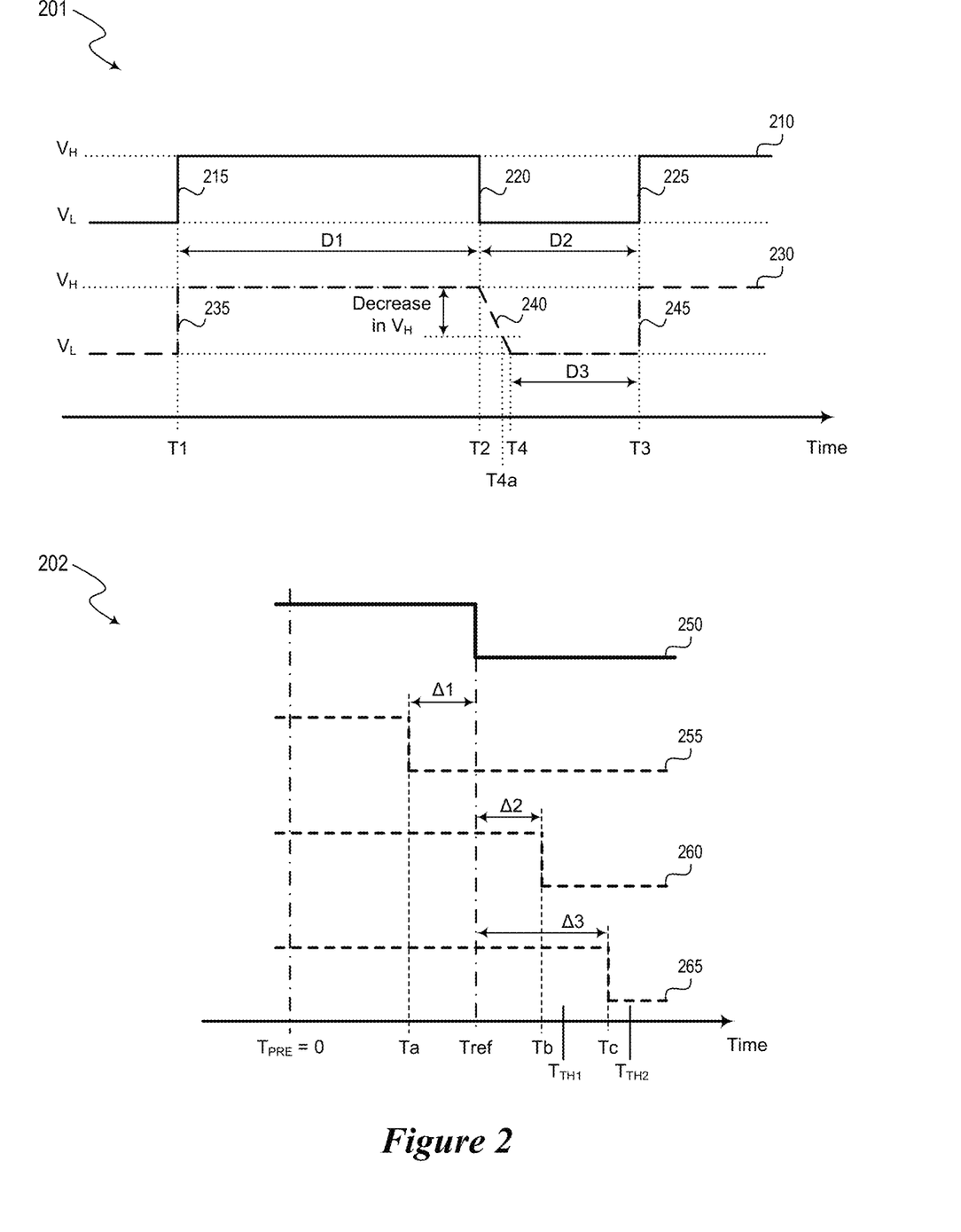
FIG. 2 illustrates timing diagrams associated with a word line degradation monitor for a memory device in accordance with embodiments of the present technology.

FIG. 2 illustrates timing diagrams 201 and 202 associated with a word line degradation monitor for a memory device (e.g., the memory device 100 described with reference to FIG. 1) in accordance with embodiments of the present technology. The timing diagram 201 includes a first waveform 210 and a second waveform 230. The first waveform 210 may correspond to a voltage of a word line (e.g., a word line of m word lines in one of the banks described with reference to FIG. 1) when a WL driver coupled to the word line is relatively pristine—e.g., not subject to noticeable degradation mechanisms. The first waveform 210 may include aspects of an ideal waveform of a voltage of a word line during memory operations. On the contrary, the second waveform 230 may correspond to a voltage of the same word line after the WL driver has been subjected to certain degradation mechanisms for a period of time.

Both the first waveform 210 and the second waveform 230 include $V_H$ representing a high voltage level and $V_L$ representing a low voltage level. In some embodiments, $V_H$ approximately corresponds to an operating voltage of the memory device described with reference to FIG. 1 (e.g., VDD, VPP, VARY), and $V_L$ to a voltage less than $V_H$ (e.g., VSS, a ground level, etc.). The diagram 201 juxtaposes the first waveform 210 and the second waveform 230 using a common time scale in a horizontal axis to compare and contrast certain aspects related to degradation of the word line. A person of ordinary skill in the art would understand that the first waveform 210 and the second waveform 230 do not represent two waveforms concurrently occurring at the same time.

The first waveform 210 includes a first rising edge 215 at time T1, a first falling edge 220 at time T2, and a second rising edge 225 at time T3. Further, the first waveform 210 includes a first duration D1 between T1 and T2, and a second duration D2 between T2 and T3. The memory device may activate a word line (e.g., brings a voltage of the word line to $V_H$) in a particular bank based on receiving an activate command (e.g., from a host device, from a memory controller), which may include signals identifying the word line (e.g., XADD and/or BADD as described with reference to FIG. 1). The activated word line may also be referred to as an "open row," for subsequent access operations that may be executed at the word line.

When the memory device brings the voltage of the word line to $V_H$, the memory device may operate a WL driver coupled to the word line. In some embodiments, the WL driver includes a CMOS circuit containing a p-channel MOSFET (which may be referred to as a "pull-up" transistor) that couples the word line to $V_H$. As such, the first rising edge 215 may occur in response to a first activate command executed at the word line. Subsequently, the memory device may perform one or more access commands (e.g., a read command, a write command) while the word line is activated—e.g., during the first duration D1.

After completing the access commands, the memory device may deactivate the word line (e.g., brings the voltage of the word line from $V_H$ to $V_L$) based on receiving a precharge command—e.g., deactivating the open row of the bank (or all banks, in some embodiments). When the memory device brings the voltage of the word line to $V_L$, the memory device may operate the WL driver coupled to the word line. In some embodiments, the CMOS circuit of the WL driver may include an n-channel MOSFET (which may be referred to as a "pull-down" transistor) that couples the word line to $V_L$. As such, the first falling edge 220 may occur in response to a first precharge command executed at the word line. The n-channel MOSFET, when activated to couple the word line to $V_L$, may be subject to the CHC mechanism as the n-channel MOSFET generates $I_{DS}$ in the saturation conduction mode.

After a word line is precharged (hence, when the voltage of the word line corresponds to $V_L$), the word line is deemed to be in an idle state, and may be required to be activated (e.g., via a second activate command) prior to one or more access commands to be issued to the memory cells coupled with the word line. As such, the memory device may activate the word line (e.g., brings the voltage of the word line to $V_H$ for the second time) based on receiving a second activate command addressed to the word line. Accordingly, the second rising edge 225 may occur in response to the second activate command executed at the word line.

In some embodiments, the memory device may need to maintain the second duration D2 between the first falling edge 220 and the second rising edge 225 at a minimum value to ensure a proper activation of the word line for consecutive activate commands executed at the same word line. When the second duration is less than the minimum value, access commands (e.g., access commands executed after the second rising edge 225) may not be carried out accurately—e.g., the data may be corrupted. In some embodiments, the manufacturer may specify the minimum value (e.g., a certain quantity of clock cycles), and configure various timings of memory operations accordingly. In some embodiments, an industry standard may include certain parameters related to such timing requirements for the memory device.

The second waveform 230 corresponding to a voltage of the word line after the WL driver has been subjected to certain degradation mechanisms for a period of time—e.g., the CHC mechanism—includes a third rising edge 235 at time T1, a second falling edge 240 extended between T2 and T4, and a fourth rising edge 245 at time T3. Further, the second waveform 230 depicts a third duration D3 between T4 and T3. As described with reference to the first waveform 210, the third rising edge 235 may occur in response to a third activate command executed at the word line. Also, the second falling edge 240 may occur in response to a second precharge command executed at the word line. The fourth rising edge 245 may occur in response to a fourth activate command executed at the word line.

Numerous access commands (e.g., read/write commands in-between activate commands and precharge commands) may have been executed at the word line between the first activate command and the third activate command. Accordingly, the n-channel MOSFET (the pull-down transistor) of the WL driver may have been subjected to the CHC degradation mechanism, which may result in a reduced $I_{DS}$ for the n-channel MOSFET generates. As a result, the WL driver may take an increased amount of time to bring the word line from $V_H$ to $V_L$ such that the second falling edge 240 of the second waveform 230 extends between T2 and T4 with a slope that depicts the increased amount of time. In contrast, the first falling edge 220 of the first waveform 210 includes a vertical slope, which depicts an instantaneous transition from $V_H$ to $V_L$.

As a consequence of the slope in the second falling edge 240, the duration D3 of the second waveform 230 may be less than the duration D2 of the first waveform 210. In some embodiments, the duration D3 may not be adequate (e.g., shorter than the minimum value defined by the manufacturer or the industry standard) for the memory device to properly activate the word line in response to the fourth activate command and/or to carry out access commands thereafter. As such, the data accessed to/from the word line after the duration D3 may not be reliable (e.g., resulting in corrupted data). Thus, the second waveform 230 may represent degradation of the word line that renders subsequent data access unreliable—e.g., due to the WL driver coupled to the word line being degraded beyond a threshold (e.g., due to the CHC mechanism adversely impacting the pull-down transistor).

The present technology may be utilized to detect such degradation of word lines (e.g., as manifested in their voltage waveforms) so as to facilitate implementing preventive measures at a sufficiently early stage to mitigate (or avoid) risks associated with reliability issues. In some cases, nomenclature for designating a particular status of a waveform may vary when a transition from one state to another state occurs over a time period as in the falling edge 240 of the second waveform 230. For example, in the second waveform 230, the word line may be regarded in the OFF state when the voltage of the word line corresponds to $V_L$ at T4. In other examples, when the voltage is decreased from $V_H$ by a predetermined amount (e.g., at time T4a, the voltage is reduced by 70% of $V_H$, 80% of $V_H$, 90% of $V_H$, etc.), the word line may be regarded in the OFF state. In yet another example, when the voltage is decreased from $V_H$ to a value within predetermined range of $V_L$ (e.g., 20%, 15%, or 10% greater than $V_L$, etc.), the word line may be regarded in the OFF state. A person of ordinary skill in the art would understand different approaches and/or certain ambiguities associated with such nomenclature.

For simple illustrations of the principles of the present technology avoiding ambiguities associated with such nomenclature, the waveforms (e.g., voltage signals) in the diagram 202 are illustrated as ideal step-functions having instantaneous downward transitions from the ON state to the OFF state. The downward transitions in the signals represent the falling edges (e.g., the first falling edge 220, the second falling edge 240) of the word line voltage waveforms that may include different degrees of degradation (thus, different slopes in their falling edges) as described below in more detail.

The diagram 202 includes a reference signal 250, a first signal 255, a second signal 260, and a third signal 265. The signals 250 through 265 may be examples of or include aspects of waveforms corresponding to voltages of word lines—e.g., the first waveform 210, the second waveform 230. In some embodiments, the memory device may generate the reference signal 250 in response to a command (e.g., a precharge command executed at $T_{PRE}$) directed to a memory array of the memory device. Taking $T_{PRE}$ as a starting point in time for the signals 250 through 265 (namely, $T_{PRE}=0$ as denoted in the diagram 202), the reference signal 250 provides a known, predetermined reference point in time (Tref), which corresponds to a downward transition (e.g., a falling edge in a word line voltage waveform) occurring upon executing the precharge command at a word line of the memory array.

In some embodiments, the reference signal 250 may include a delay that the manufacturer of the memory device may determine. For example, the delay may be determined based on one or more parameters of a product specification and certain margins built in for the parameters. In some cases, such parameters may be related to operational speeds of the memory device, such as a row precharge time (a quantity of clock cycles between issuing a precharge command and activating a next word line), a row active time (a quantity of clock cycles between an activate command and issuing a precharge command), or the like. In other examples, the delay may be determined based on an industry standard—e.g., a standard published by the Joint Electron Device Engineering Council (JEDEC), which includes parameters related to various timing requirements for memory devices.

Further, the delay may include certain margins devised to account for accelerated degradation that a word line (e.g., a first victim WL driver coupled to a victim word line and/or a second victim WL driver coupled to an RC component as described with reference to FIG. 3) may artificially experience by design. For example, a victim word line of a bank may be configured to be accessed (e.g., the first victim WL driver coupled to the victim word line may be activated) each time other word lines of the bank are accessed. As such, the first victim WL driver coupled to the victim word line may represent a worst-case degradation for the WL drivers coupled with other word lines of the bank. By way of example, when the bank includes a total of 512 word lines (including the victim word line), the victim word line may be accessed at least 511 times, assuming every word line of the bank is accessed at least once. Accordingly, the margin may be determined to avoid premature determination of the memory array deemed to be unreliable (which may be determined by the degradation manifested by the switching characteristics related to the victim word line) by taking various considerations into account—e.g., design configurations related to a ratio between the victim word line with respect to other word lines of the memory array (or a bank), the frequency of activating the victim word line when other word lines of the memory array are accessed, etc.

In some embodiments, the delay may be variable (e.g., variable delays determined by the manufacturer of the memory device). For example, the manufacturer may determine to implement different delays in the reference signal to account for different usage scenarios based on application areas in which the memory device operates—e.g., memory devices aiming to operate in ADAS applications may have a different delay when compared to delays included in memory devices aiming to operate in IOT applications. In some embodiments, the manufacturer may determine and store multiple delays in a nonvolatile memory component of the memory device (e.g., a fuse array, flash memory cells including NAND and/or NOR memory cells, PCM cells) such that the memory device may implement different delays based on the application areas. In some embodiments, the reference signal 250 may not include a delay such that the reference signal 250 may represent an approximately ideal transition in the voltage waveform of a word line when the command (e.g., the precharge command) is executed at a word line.

The first signal 255, the second signal 260, and the third signal 265 may represent voltage waveforms from word lines (e.g., victim word lines) having different degrees of degradation—e.g., due to the CHC mechanism degrading the pull-down transistor of the CMOS circuit. For example, the third signal 265 may represent the worst word line degradation among the three signals 255 through 265 because the downward transition in the third signal 265 occurs at Tc with respect to $T_{PRE}$, which is later than Ta or Tb for the downward transitions of the first signal 255 or the second signal 260, respectively. Accordingly, the third signal 265 may be regarded as having the most gradual slope transitioning from $V_H$ to $V_L$ in executing the precharge command at the third victim word line, when compared to the first signal 255 and/or the second signal 260.

When the Reference Signal 250 Includes a Delay:

The first signal 255 may represent a voltage waveform of a first victim word line of a first bank of a memory array. The first signal 255 includes a first downward transition occurring at Ta. As Ta occurs before Tref by an amount of time $\Delta 1$, word lines of the first bank including the first victim word line may be regarded as reliable word lines without degradation that needs to be notified to a host device or to take certain preventive measures. Thus, the memory device and/or the host device coupled with the memory device may not need to take any action to manage the word line degradation.

The second signal 260 may represent a voltage waveform of a second victim word line of a second bank of the memory array. The second signal 260 includes a second downward transition occurring at Tb. As Tb occurs after Tref by an amount of time $\Delta 2$, word lines of the second bank including the second victim word line may be regarded as unreliable word lines (or expected to experience reliability issue due to the word line degradation), assuming that the memory device includes no additional margin—e.g., additional margin against the word line degradation—beyond the delay included in the reference signal 250. Thus, the memory device may determine that the transition in the second signal 260 lags behind the transition in the reference signal 250, and notify a host device (or a memory controller) of such determination to indicate that the word lines of the second bank may be deemed unreliable. In some embodiments, the memory device may assert an alert pin configured to transmit a signal indicative of the determination to the host device. As such, the host device may be notified of the decision via the signal transmitted by asserting the alert pin. In some embodiments, the host device may determine to deactivate (e.g., retire from memory operations) the memory device (or the second bank of the memory device) upon receiving the notification.

Additionally, or alternatively, the memory device may store an indication of the determination in a register (e.g., the multi-purpose registers (MPR) described with reference to FIG. 1) of the memory device. For example, the memory device may program (e.g., set) certain bits in the MPR to indicate that the word lines of the second bank may become unreliable due to the word line degradation as manifested by the second signal 260 from the second victim word line. Further, such indication stored in the register may facilitate identification of a root cause of the word line degradation—e.g., the CHC mechanism degrading the pull-down transistor of a WL driver based on the delayed downward transition at Tb in comparison to Tref. In this manner, the indication stored in the register may be useful not only to take preventive measures but also to identify root-cause(s) of the reliability issues that the memory device experiences.

In some cases, the manufacturer may read the MPR of the memory device to further analyze reliability issues indicated in the MPR—e.g., whether the delay included in the reference signal is properly determined to avoid premature and/or delayed notifications, whether the bank deemed to be unreliable is indeed unreliable (e.g., experiencing corrupted data), etc. In some cases, the memory device may read the MPR upon initialization, and determine to route access commands addressed to an unreliable bank (e.g., the second bank) to reliable banks (e.g., the first bank) of the memory array. In some cases, the memory device may block access commands addressed to the unreliable bank based on reading the MPR.

In some embodiments, the memory device may be configured to manage the word line degradation based on an amount of time difference in the downward transitions between the reference signal 250 and the signals from the victim word lines—e.g., $\Delta 2$ between the reference signal 250 and the second signal 260, $\Delta 3$ between the reference signal 250 and the third signal 265, respectively. For example, the memory device may determine that $\Delta 2$ is greater than zero (indicating a certain degree of word line degradation), but less than the first threshold $T_{TH1}$. Subsequently, the memory device may take a first set of precautionary measures—e.g., applying a stronger error correction algorithm for the data (e.g., data read from the second bank), but keeping the bank in the memory operations. When the memory device determines the amount of time difference is greater than the first threshold $T_{TH1}$, but less than a second threshold $T_{TH2}$ (e.g., $\Delta 3$ of the third signal 265 from the third bank), the memory device may take a second set of precautionary measures—e.g., routing access commands directed to the third bank to a different bank (e.g., the first bank), while keeping the memory device in the memory operation with a reduced storage capacity. When the memory device determines the amount of time difference is greater than the second threshold $T_{TH2}$, the memory device may take a third set of precautionary measures—e.g., blocking access commands directed to the memory device, i.e., retiring itself from the memory operations.

When the Reference Signal 250 Includes No Delay:

In some embodiments, the memory device may be configured to generate the reference signal 250 without including a delay. In such embodiments, the reference signal 250 may represent a nearly ideal voltage waveform of a word line coupled to an ideal WL driver (e.g., WL driver not having been subjected to a degradation mechanism, such as the CHC mechanism), when a command (e.g., a precharge command) is executed at the word line. In such embodiments, the memory device may compare the downward transition included in the reference signal 250 with respect to the downward transitions included in the signals from the victim word lines (e.g., the second signal 260, the third signal 265). Subsequently, the memory device may determine the downward transitions in the signals from the victim word line lag behind the downward transition included in the reference signal by more than a predetermined amount (e.g., the first threshold $T_{TH1}$, the second threshold $T_{TH2}$). Moreover, the memory device may take various precautionary measures based on the determination.

By way of example, when the memory device determines that Δ2 between the reference signal 250 and the second signal 260 is less than the first threshold $T_{TH1}$, the memory device (or the host device) may not need to take any precautionary measures as the degradation (e.g., Δ2 greater than zero) detected from the second victim word line may be deemed to be safe—e.g., less than the predetermined amount of time (e.g., an indication of degradation) included in the first threshold $T_{TH1}$. Hence, the second bank may be deemed reliable. In another example, when the memory device determines that Δ3 between the reference signal 250 and the third signal 265 is greater than the first threshold $T_{TH1}$, but less than the second threshold $T_{TH2}$, the memory device (or the host device) may take certain precautionary measures—e.g., applying a stronger error correction algorithm for the data from the third bank, routing access commands directed to the third bank to a different bank (e.g., the first bank), etc.

Although in the foregoing examples, the timing schemes for monitoring word line degradation have been described with respect to comparing one common reference signal and one signal per bank (e.g., the first signal 255 from the first bank, the second signal 260 from the second bank, the third signal 265 from the third bank), the present technology is not limited thereto. For example, in lieu of (or in addition to) the common reference signal, each bank may be configured to have its own reference signal, which may be identical or different from each other. In some examples, the memory device may be configured to generate multiple reference signals (e.g., to improve accuracy of detecting and determining word line degradation). Such multiple reference signals may be commonly used across multiple banks or each bank may be configured to have its own multiple reference signals.

In some examples, each bank may be configured to include multiple victim word lines. Further, each victim word lines (and the WL drivers coupled thereto) may be configured to experience same or different accelerated degradation. For example, a bank may be configured to include three (3) victim word lines. In some cases, all three victim word lines may be accessed every $n^{th}$ time an access command is executed at the bank—e.g., to increase a confidence level in detecting and determining word line degradation for the bank. In some cases, a first victim word line of the bank may be accessed every $i^{th}$ time an access command is executed at the bank while a second victim word line of the bank may be accessed every $j^{th}$ time, and a third victim line of the bank may be accessed every $k^{th}$ time, where i, j, and k are different from each other. Such a configuration may facilitate analyzing characteristics of degradation mechanism to improve reliability of the memory device.

Figure 3:
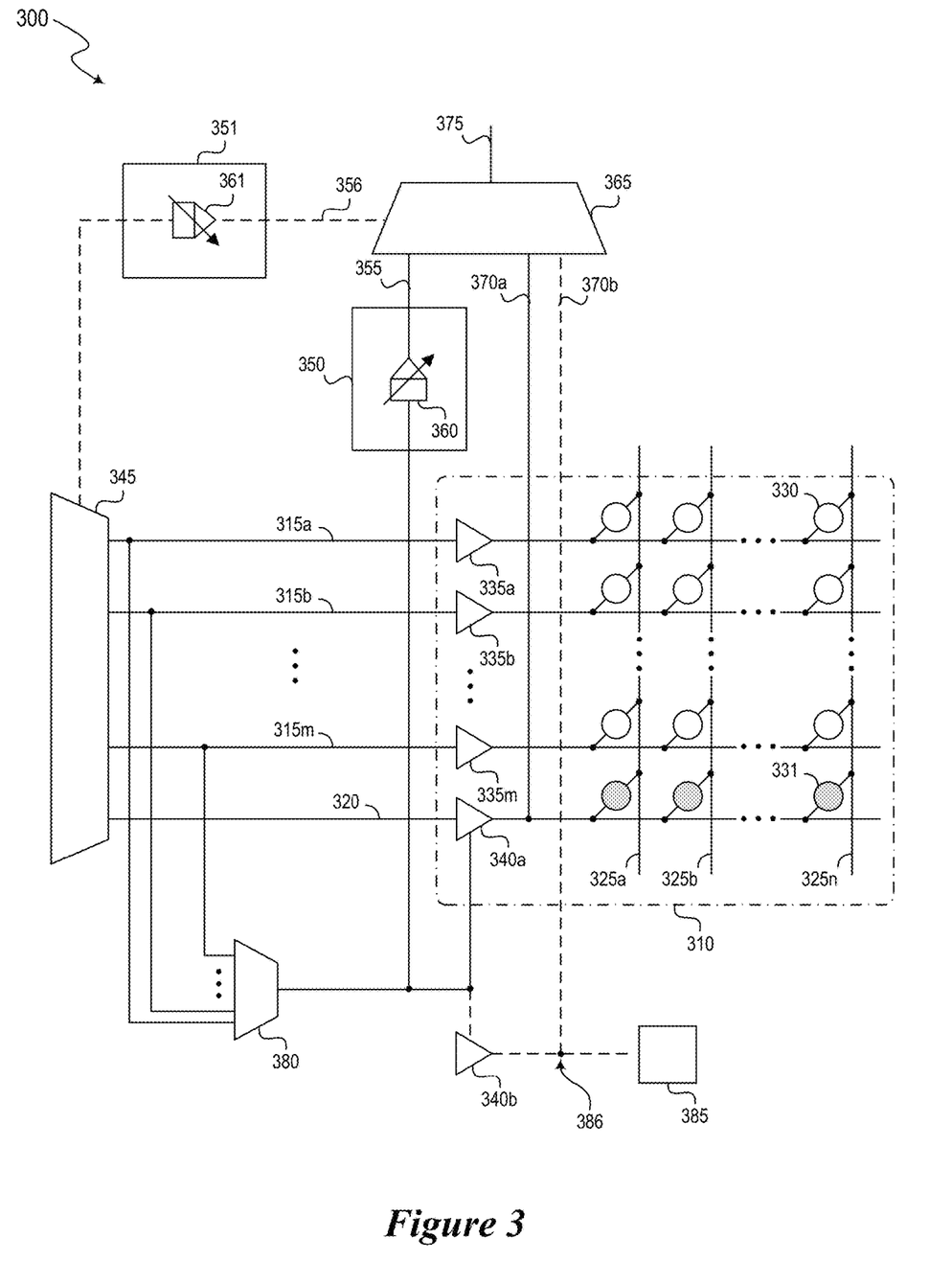
FIG. 3 is a block diagram illustrating a word line degradation monitor for a memory device in accordance with embodiments of the present technology.

FIG. 3 is a block diagram 300 illustrating a word line degradation monitor for a memory device (e.g., the memory device 100 described with reference to FIG. 1) in accordance with embodiments of the present technology. The diagram 300 includes a memory array 310 (which may be an example of or include aspects of the memory array 150), a word line decoder 345 (which may be an example of or include aspects of the row decoder 140), a peripheral circuit 380, a reference component 350, and a comparison circuit 365, among others.

The memory array 310 may represent an array of memory cells included in the memory device. In some embodiments, the memory array 310 may represent a bank of multiple banks included in the array of memory cells (e.g., one of the banks 0 through 15 included in the memory array 150 of the memory device 100). The memory array 310 may be configured to include a plurality of word lines 315 (e.g., word lines 315a through 315m) and a plurality of bit lines 325 (e.g., bit lines 325a through 325n). Further, the memory array 310 includes a plurality of memory cells 330 (e.g., m×n memory cells) configured to store user data, which are arranged at intersections of the word lines (e.g., m word lines) and the bit lines (e.g., n bit lines). In some cases, the word lines having the memory cells that store user data may be referred to as "live" word lines. In some embodiments, the memory array 310 also includes a victim word line (e.g., a victim word line 320) and memory cells 331 coupled with the victim word line (depicted as filled circles). The memory cells coupled with the victim word line may not be available to store user data—e.g., the memory cells 331 are hidden from a host device coupled with the memory device.

In some embodiments, the memory array 310 may include more than the single victim word line 320 depicted in the diagram 300. For example, the memory array 310 may include multiple victim word lines (e.g., two (2), four (4), eight (8), or even more) distributed throughout the memory array 310. Further, such victim word lines may be placed anywhere in the memory array 310—e.g., near or at a lower boundary of the memory array 310, near or at an upper boundary of the memory array 310, somewhere in the middle of the memory array 310, etc. Additionally, or alternatively, one or more word lines of the m word lines may be identified (or designated) as victim word lines, in some cases.

Each of the word lines of the memory array 310 may be coupled with a WL driver 335 (or include a WL driver). The WL driver may include a CMOS circuit configured to establish a voltage of the word line during memory operations—e.g., $V_H$ and $V_L$ described with reference to FIG. 2. In some embodiments, the CMOS circuit of the WL driver may include a p-channel MOSFET (a pull-up transistor) and an n-channel MOSFET (a pull-down transistor). The diagram 300 depicts that each of the word lines 315 is coupled to (or include) a corresponding WL driver 335 (e.g., one of WL drivers 335a through 335m). Further, the diagram 300 depicts a WL driver 340a (a first victim WL driver 340a) coupled to (or included in) the victim word line 320. The first victim WL driver 340a and the victim word line 320 may be identical to the WL drivers 335 and the word lines 315 in their physical and/or structural configurations.

The word lines (e.g., live word lines and/or victim word lines) of the memory array 310 are coupled with the word line decoder 345, which may be further coupled with an address decoder (e.g., the address decoder 110) and/or a command decoder (e.g., the command decoder 115). As such, the word line decoder 345 may identify a particular word line that a command directed to the memory array 310 addresses to—e.g., identifying the particular word line based on a bank address (BADD) and a row address (XADD) included in the command.

For example, the memory device may receive an activate command directed to the memory array 310, and the word line decoder 345 may identify the word line 315b based on decoding the activate command. Accordingly, the memory device (in conjunction with the word line decoder 345) may activate the WL driver 335b that is coupled with the word line 315b such that the word line 315b may establish $V_H$ (e.g., after the rising edge 215 or the rising edge 235) as a result of executing the activate command. Subsequently, the memory device may receive a precharge command directed to the memory array 310, and the word line decoder 345 may identify the word line 315b based on decoding the precharge command. Accordingly, the memory device (in conjunction with the word line decoder 345) may activate the WL driver 335b such that the word line 315b may establish $V_L$ (e.g., after the falling edge 220 or the falling edge 240).

The word lines (e.g., live word lines) of the memory array 310 are further coupled with the peripheral circuit 380 to provide inputs thereto. The peripheral circuit 380 may be configured to activate the first victim WL driver 340a coupled with (or included in) the victim word line 320 whenever a word line (e.g., one of the word lines 315a through 315m) of the memory array 310 is accessed (e.g., via an activate command and/or a precharge command). In this manner, the first victim WL driver 340a may represent a worst-case scenario with respect to the degradation that a WL driver (e.g., one of the WL drivers 335a through 335m) may experience—e.g., due to the CHC mechanism adversely impacting the n-channel MOSFET (the pull-down transistor) of the WL driver.

The block diagram 300 also illustrates a second victim WL driver 340b coupled to an RC component 385. The memory device may include the first victim WL driver 340a or the second victim WL driver 340b, or both. The RC component 385 may be configured to model a distributed RC network associated with a true word line (e.g., one of the live word lines 315). In some embodiments, the RC component 385 may be configured to include different impedance values and/or settings (i.e., multiple impedance values and/or settings) such that the memory device may determine a particular setting of the RC component 385 based on various situations—e.g., supporting different primary usage cases (e.g., ADAS applications, IOT applications) that the memory device may serve, providing diagnostic tools for root-cause analyses for reliability issues, evaluating various interactions between process technologies and design alternatives, determining optimum conditions for the various factors (e.g., D2, delays to include in the reference signal, $T_{TH1}$, $T_{TH2}$) described with reference to FIGS. 2, or the like. Further, the second victim WL driver 340b may be activated as described herein (e.g., every time when a live word line is accessed, every $k^{th}$ time a live word line is accessed, etc., via the peripheral circuit 380). In some embodiments, the memory device may include multiple second victim WL drivers that each couple to corresponding RC components. In such embodiments, each of the RC components may be configured to have a fixed impedance setting.

In some embodiments, the peripheral circuit 380 may be configured to connect to (e.g., tapped to) a subset of word lines 315, instead of each of the word lines 315. In some cases, such a configuration may facilitate to avoid excessive degradation that the first and/or second victim WL drivers 340 accumulate (e.g., to avoid excessively stressing the n-channel MOSFET of the first and/or second victim WL drivers 340). Additionally, or alternatively, the memory device may be configured to track a quantity of access operations executed at the live word lines, such that the memory device (in conjunction with the peripheral circuit 380, in some cases) may activate the first victim WL driver 340a (and/or the second victim WL driver 340b) every $n^{th}$ access command executed at the live word lines. For example, the memory device may activate the first and/or second victim WL drivers 340 every $5^{th}$ (or $10^{th}$, $20^{th}$, even more) access command executed at the live word lines.

Frequency of activating the first and/or second victim WL drivers 340 (thus, subjecting the n-channel MOSFET therein to the CHC mechanism, for example), in relation to the access commands executed at the live word lines, may be a factor in determining a delay to include in a reference signal (e.g., the reference signal 250) and/or a predetermined threshold (e.g., $T_{TH1}$, $T_{TH2}$) described with reference to FIG. 2.

The reference component 350 of the diagram 300 may be configured to generate a reference signal 355 (e.g., the reference signal 250 described with reference to FIG. 2) in response to a command directed to the memory array 310. The reference component 350 may be coupled with the memory array 310 through the peripheral circuit 380 such that the reference component 350 generates the reference signal 355 when the peripheral circuit 380 activates the first and/or second victim WL drivers 340. The reference component 350 may include a delay component 360, in some embodiments. The delay component 360 may be configured to incur a variable delay to the reference signal 355. In some embodiments, the delay component 360 may include one or more logic components arranged in a series.

In some embodiments, the manufacturer of the memory device may determine the variable delay based on several aspects, such as areas of primary application in which the memory device is utilized, technologies used to fabricate the memory device (and thus, the WL drivers), degradation mechanisms to guard against (e.g., the CHC mechanism), etc. In some embodiments, the variable delay may be correlated to a parameter associated with sequentially accessing a word line of the plurality—e.g., the second duration D2, the third duration D3 described with reference to FIG. 2. Additionally, or alternatively, the variable delay may be correlated to an acceleration factor related to executing multiple access operations on a word line of the plurality—e.g., memory cells of a word line (or a bank) may be more frequently accessed when compared to other memory cells of different word lines (or different banks), hence experiencing an accelerated degradation.

The block diagram 300 also illustrates an alternative (or additional) implementations of the reference component 351 configured to generate a reference signal 356 in response to a command directed to the memory array 310. The reference component 351 may be coupled with the memory array 310 through the word line decoder 345 such that the reference component 351 may generate the reference signal 356 when the word line decoder 345 activates one of the word lines 315. As described herein, however, the memory device may activate the first and/or second victim WL drivers 340 every $n^{th}$ commands executed at the live word lines 315 and thus, the reference component 350 (and/or the 351) may generate the reference signal 355 (and/or the reference signal 356) correspondingly (i.e., at every $n^{th}$ commands).

The comparison circuit 365 may be configured to monitor the reference signal 355 (or the reference signal 356) from the reference component 350 (or the reference component 351), as well as a signal 370a from the memory array 310 (e.g., from the first victim WL driver 340a) and/or a signal 370b from the second victim WL driver 340b). The signals 370 may be associated with a command executed at the victim word line 320—e.g., the first signal 255, the second signal 260, the third signal 265 described with reference to FIG. 2, and/or with switching characteristics at a node 386 that simulates voltage switching characteristics related to a true word line of the memory array. The comparison circuit 365 may be configured to detect a first transition in the signal 370a and/or in the signal 370b and a second transition in the reference signal 355 (or the reference signal 356). In some cases, the comparison circuit 365 may determine that the first transition occurs after the second transition (by a predetermined amount, in some embodiments). The comparison circuit 365 may generate an output 375 containing information related to the comparison. In some embodiments, the memory device may store an indication of the determination (and/or the information related to the comparison) in a register (e.g., multi-purpose registers) based on the output 375 from the comparison circuit 365. In some embodiments, the memory device may notify a host device of the determination.

Although the diagram 300 illustrates one comparison circuit (e.g., the comparison circuit 365) coupled with one memory array (e.g., the memory array 310) to describe principles of the present technology, in other embodiments, memory devices may be provided with alternative arrangements. For example, one comparison circuit may be shared by multiple banks of an array of memory cells—e.g., to facilitate efficient usage of die area of the memory devices. In other examples, more than one comparison circuits may be coupled with one memory array (or bank)—e.g., to facilitate making a faster determination of the word line degradation.

Figure 4:
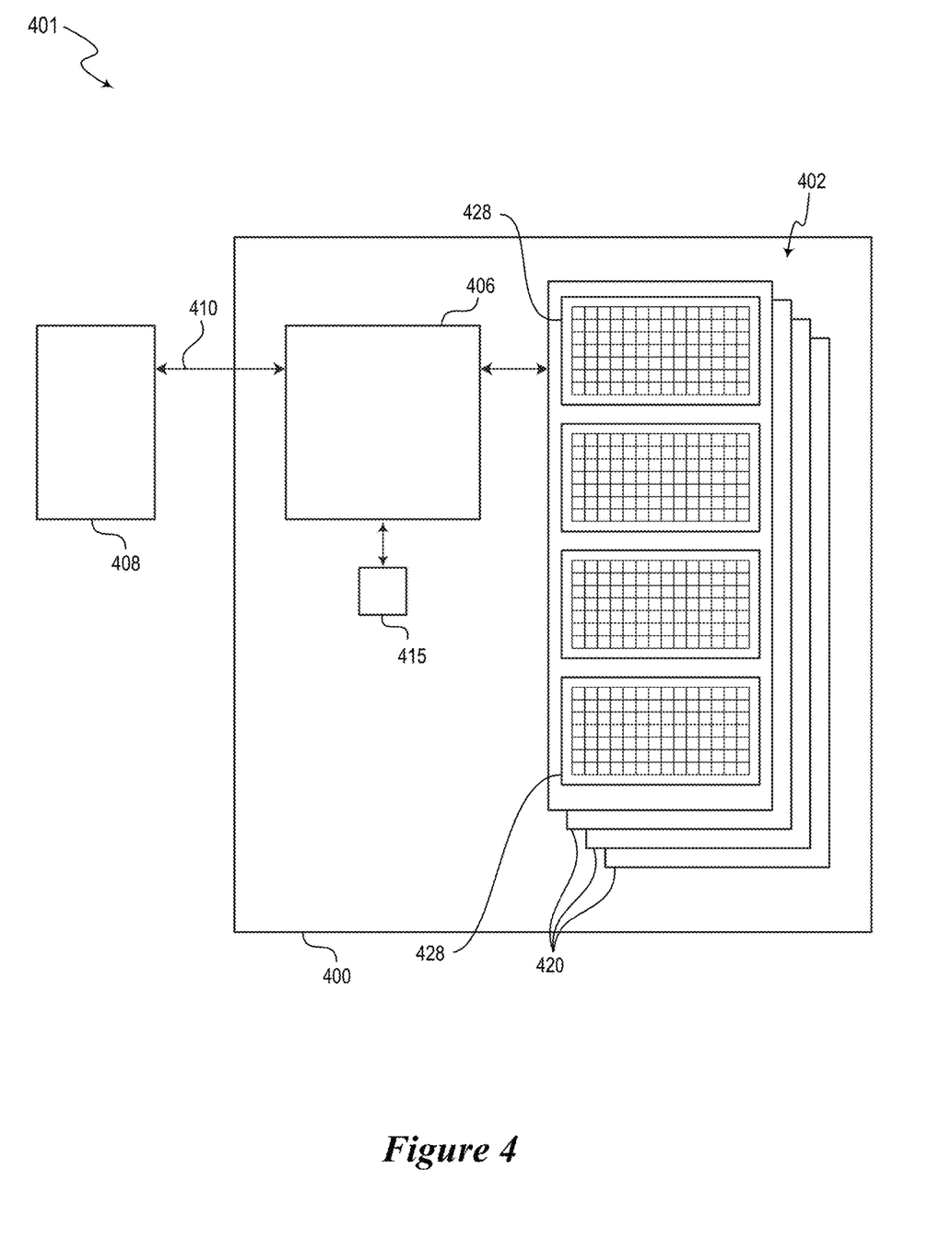
FIG. 4 is a block diagram of a system having a memory device configured in accordance with embodiments of the present technology.

FIG. 4 is a block diagram of a system 401 having a memory device 400 configured in accordance with embodiments of the present technology. The memory device 400 may be an example of or include aspects of the memory device 100 described with reference to FIGS. 1 through 3. As shown, the memory device 400 includes a main memory 402 (e.g., DRAM, NAND flash, NOR flash, FeRAM, PCM, etc.) and control circuitry 406 operably coupled to a host device 408 (e.g., an upstream central processor (CPU), a memory controller). The control circuitry 406 may include aspects of various components described with reference to FIGS. 1 through 3. For example, the control circuitry 506 may include aspects of the command/address input circuit 105, the address decoder 110, the command decoder 115, the word line decoder 345, the reference component 350, the peripheral circuit 380, and the comparison circuit 365, among others.

The main memory 402 includes a plurality of memory units 420, which each include a plurality of memory cells. The memory units 420 can be individual memory dies, memory planes in a single memory die, a stack of memory dies vertically connected with through-silicon vias (TSVs), or the like. For example, in one embodiment, each of the memory units 420 can be formed from a semiconductor die and arranged with other memory unit dies in a single device package. In other embodiments, multiple memory units 420 can be co-located on a single die and/or distributed across multiple device packages. The memory units 420 may, in some embodiments, also be sub-divided into memory regions 428 (e.g., banks, ranks, channels, blocks, pages, etc.).

The memory cells can include, for example, floating gate, charge trap, phase change, capacitive, ferroelectric, magnetoresistive, and/or other suitable storage elements configured to store data persistently or semi-persistently. The main memory 402 and/or the individual memory units 420 can also include other circuit components, such as multiplexers, decoders, buffers, read/write drivers, address registers, data out/data in registers, etc., for accessing and/or programming (e.g., writing) the memory cells and other function, such as for processing information and/or communicating with the control circuitry 406 or the host device 408. Although shown in the illustrated embodiments with a certain number of memory cells, rows, columns, regions, and memory units for purposes of illustration, the number of memory cells, rows, columns, regions, and memory units can vary, and can, in other embodiments, be larger or smaller in scale than shown in the illustrated examples. For example, in some embodiments, the memory device 400 can include only one memory unit 420. Alternatively, the memory device 400 can include two, three, four, eight, ten, or more (e.g., 16, 32, 64, or more) memory units 420. Although the memory units 420 are shown in FIG. 4 as including four memory regions 428 each, in other embodiments, each memory unit 420 can include one, two, three, eight, or more (e.g., 16, 32, 64, 100, 128, 256, or more) memory regions.

In one embodiment, the control circuitry 406 can be provided on the same die as the main memory 402 (e.g., including command/address/clock input circuitry, decoders, voltage and timing generators, input/output circuitry, etc.). In another embodiment, the control circuitry 406 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 406 can include a processor configured to execute instructions stored in memory to perform various processes, logic flows, and routines for controlling operation of the memory device 400, including managing the main memory 402 and handling communications between the memory device 400 and the host device 408. In some embodiments, the control circuitry 406 can include embedded memory with memory registers for storing, e.g., row counters, bank counters, memory pointers, fetched data, etc. In another embodiment of the present technology, a memory device 400 may not include control circuitry, and may instead rely upon external control (e.g., provided by the host device 408, or by a processor or controller separate from the memory device 400).

The host device 408 can be any one of a number of electronic devices capable of utilizing memory for the temporary or persistent storage of information, or a component thereof. For example, the host device 408 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 408 may be a networking device (e.g., a switch, a router, etc.) or a recorder of digital images, audio and/or video, a vehicle, an appliance, a toy, or any one of a number of other products. In one embodiment, the host device 408 may be connected directly to memory device 400, although in other embodiments, the host device 408 may be indirectly connected to memory device (e.g., over a networked connection or through intermediary devices).

In operation, the control circuitry 406 can directly write or otherwise program (e.g., erase) the various memory regions of the main memory 402. The control circuitry 406 communicates with the host device 408 over a host-device bus or interface 410. In some embodiments, the host device 408 and the control circuitry 406 can communicate over a dedicated memory bus (e.g., a DRAM bus). In other embodiments, the host device 408 and the control circuitry 406 can communicate over a serial interface, such as a serial attached SCSI (SAS), a serial AT attachment (SATA) interface, a peripheral component interconnect express (PCIe), or other suitable interface (e.g., a parallel interface). The host device 408 can send various requests (in the form of, e.g., a packet or stream of packets) to the control circuitry 406. A request can include a command to read, write, erase, return information, and/or to perform a particular operation (e.g., a refresh operation, a TRIM operation, a precharge operation, an activate operation, a wear-leveling operation, a garbage collection operation, etc.).

In some embodiments, the memory device 400 includes a memory array (e.g., the main memory 402) that may include a memory bank having a plurality of word lines that includes a victim word line. Additionally, or alternatively, the memory device 400 may include one or more victim WL drivers that each are coupled to corresponding RC components (e.g., the RC component 385). In some cases, the RC components may model a distributed RC network of a true word line. In some cases, the RC components can be configured to include different impedance settings. The memory device 400 may include a reference component (e.g., the reference component 350, the reference component 351) coupled with the memory array, and configured to generate a reference signal in response to a command directed to the memory array. Further, the memory device 400 may include a comparison circuit (e.g., the comparison circuit 365) coupled with the memory array and the reference component. The comparison circuit may be configured to monitor the reference signal from the reference component, monitor a first signal from the memory bank (and/or a signal from the victim WL driver coupled to the RC component), where the first signal is associated with the command executed at the victim word line, detect a first transition in the first signal (and/or the signal from the victim WL driver) and a second transition in the reference signal, determine that the first transition occurs after the second transition, and notify the host device of the determination.

In some embodiments, the memory device 400 may be further configured to store an indication of the determination in a register 415 of the memory device (which may be an example of or include aspects of the registers 118 described with reference to FIG. 1), and assert an alert pin configured to transmit a signal indicative of the determination (e.g., via the host-device bus or interface 410), where notifying the host device is based on asserting the alert pin. In some embodiments, the host device 408 may determine whether to deactivate the memory device 400 based on receiving the notification. In some cases, the host device 408 (or the memory device 400) may take different preventive measures based on areas of application in which the memory devices are utilized. For example, when the memory device 400 supports an application related to safety features of vehicles (e.g., intelligent brake control systems, airbag deployment systems, steering wheel control systems), the host device 408 may retire (e.g., deactivate) the memory device 400 upon receiving the notification. In other examples, when the memory device 400 supports an application related to infotainment features of vehicles (e.g., storing files containing favorite songs of the drivers), the host device 408 may continue to operate with the memory device 400 with a reduced storage capacity (e.g., by re-routing commands directed to the unreliable banks to other banks of the memory device 400).

Figure 5:
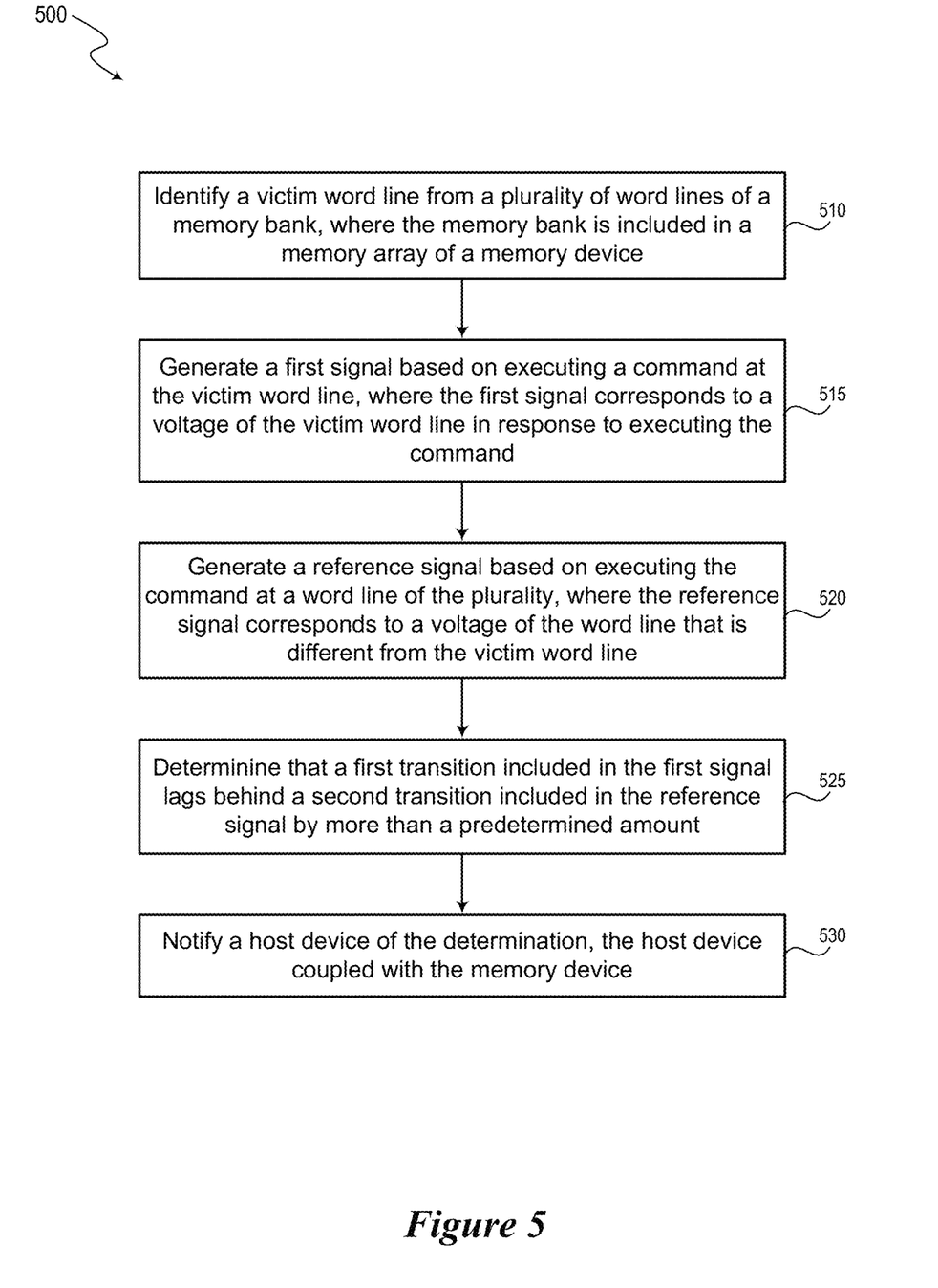
FIG. 5 is a flowchart illustrating a method of operating a memory device in accordance with embodiments of the present technology.

FIG. 5 is a flow chart 500 illustrating a method of operating a memory device in accordance with embodiments of the present technology. The flow chart 500 may be an example of or include aspects of a method that the memory device 100 (e.g., the command/address input circuit 105, the address decoder 110, the command decoder 115, the first and/or second victim WL drivers 340, the word line decoder 345, the reference component 350, the peripheral circuit 380, and the comparison circuit 365, or a combination thereof) may perform as described with reference to FIGS. 1 through 3.

The method includes identifying a victim word line from a plurality of word lines of a memory bank, where the memory bank is included in a memory array of a memory device (box 510). In accordance with one aspect of the present technology, the identifying feature of box 510 can be performed by the address decoder 110, in conjunction with the word line decoder 345 in some cases, as described with reference to FIGS. 1 through 3.

The method further includes generating a first signal based on executing a command at the victim word line, where the first signal corresponds to a voltage of the victim word line in response to executing the command (box 515). In accordance with one aspect of the present technology, the generating feature of box 515 can be performed by the first victim WL driver 340a, in conjunction with the word line decoder 345 in some cases, as described with reference to FIGS. 1 through 3.

The method further includes generating a reference signal based on executing the command at the word line of the plurality, where the reference signal corresponds to a voltage of the word line that is different from the victim word line (box 520). In accordance with one aspect of the present technology, the generating feature of box 520 can be performed by the reference component 350, in conjunction with the word line decoder 345 in some cases, as described with reference to FIGS. 1 through 3.

The method further includes determining that a first transition included in the first signal lags behind a second transition included in the reference signal by more than a predetermined amount (box 525). In accordance with one aspect of the present technology, the determining feature of box 525 can be performed by the comparison circuit 365 as described with reference to FIGS. 1 through 3.

The method further includes notifying a host device of the determination, the host device coupled with the memory device (box 530). In accordance with one aspect of the present technology, the notifying feature of box 530 can be performed by the comparison circuit 365 as described with reference to FIGS. 1 through 3.

In some embodiments, the method can further include activating a word line driver coupled to the victim word line whenever a word line of the plurality is accessed, where the word line corresponds to any word line of the plurality other than the victim word line. In some embodiments, the predetermined amount may be associated with degradation of a word line driver including a switching component, the word line driver coupled to the victim word line. In some embodiments, generating the reference signal includes adding a variable delay to the reference signal, the variable delay related to the predetermined amount.

In some embodiments, the command includes a precharge command. In some embodiments, determining that the first transition included in the first signal lags behind the second transition included in the reference signal by more than the predetermined amount further includes detecting the first transition corresponding to a decrease in the voltage of the victim word line, and detecting the second transition corresponding to a decrease in the voltage of the word line of the plurality. In some embodiments, the method can further include storing an indication of the determination in a register of the memory device.

It should be noted that the methods described above describe possible implementations, and that the operations and the steps may be rearranged or otherwise modified and that other implementations are possible. Furthermore, embodiments from two or more of the methods may be combined.

In the foregoing example embodiments described with reference to FIGS. 1 through 5, the word line degradation monitoring for memory devices has been described and illustrated with respect to a certain set of conditions, such as the CHC mechanism occurring in a particular switching component (e.g., n-channel MOSFETs) of a circuit (e.g., a WL driver), which may deteriorate characteristics related to a downward transition (e.g., a falling edge) in a voltage waveform of a word line in response to executing a command (e.g., a precharge command). The present technology, however, is not limited thereto. For example, in other embodiments, characteristics related to an upward transition (e.g., a rising edge) in the waveform of a word line in response to executing a different command (e.g., an activate command) may be monitored to detect and determine word line degradation. Such degradation may be associated with one or more different switching components (e.g., p-channel MOSFETs), different degradation mechanisms other than the CHC mechanism, different circuit configurations in controlling the voltage of word lines, etc. In other examples, the present technology may be utilized to monitor degradations in the characteristics related to the downward (and/or upward) transition due to changes in properties of materials included in the word lines (e.g., conductive layers including metallic elements, dopants, etc.), in addition to the changes in electrical properties of the switching components (e.g., the n-channel and/or p-channel MOSFETs).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
   a memory array including a memory bank having a plurality of word lines;
   a comparison circuit coupled with the memory array and configured to:
      detect a first signal from the memory bank, wherein the first signal is associated with a command executed at a word line of the plurality;
      detect a first transition in the first signal and a second transition in a reference signal;
      determine that the first transition occurs after the second transition; and
      notify a host device of the determination.

2. The apparatus of claim 1, further comprising:
   a peripheral circuit coupled with a word line driver of the word line that is associated with the first signal, and configured to activate the word line driver whenever other word lines of the plurality are accessed, wherein the other word lines correspond to any word line of the plurality other than the word line associated with the first signal.

3. The apparatus of claim 1, wherein the command includes a precharge command.

4. The apparatus of claim 1, further comprising a reference component configured to generate the reference signal, and to incur a variable delay to the reference signal.

5. The apparatus of claim 4, wherein the variable delay is correlated to a parameter associated with sequentially accessing a word line of the plurality, an acceleration factor related to executing multiple access operations on a word line of the plurality, or both.

6. The apparatus of claim 1, wherein the first signal corresponds to a voltage of the word line in response to the command executed at the word line.

7. The apparatus of claim 6, wherein the first transition corresponds to a decrease in the voltage of the word line.

8. The apparatus of claim 1, wherein the reference signal corresponds to a voltage of a word line of the plurality in response to the command executed at the word line, wherein the word line is a word line of the plurality other than the word line associated with the first signal.

9. The apparatus of claim 8, wherein the second transition corresponds to a decrease in the voltage of the word line of the plurality.

10. The apparatus of claim 1, wherein the word line is coupled with a group of memory cells hidden from a host device coupled with the apparatus.

11. A method, comprising:
identifying a victim word line from a plurality of word lines of a memory bank, wherein the memory bank is included in a memory array of a memory device;
generating a first signal based, at least in part, on executing a command at the victim word line, wherein the first signal corresponds to a voltage of the victim word line in response to executing the command;
determining that a first transition included in the first signal lags behind a second transition included in a reference signal by more than a predetermined amount; and
notifying a host device of the determination.

12. The method of claim 11, further comprising:
activating a word line driver coupled to the victim word line whenever the word line of the plurality is accessed, wherein the word line corresponds to any word line of the plurality other than the victim word line.

13. The method of claim 11, wherein the predetermined amount is associated with degradation of a word line driver including a switching component, the word line driver coupled to the victim word line.

14. The method of claim 11, further comprising generating the reference signal and adding a variable delay to the reference signal, the variable delay related to the predetermined amount.

15. The method of claim 11, wherein the command includes a precharge command.

16. The method of claim 11, wherein the determination further comprises:
detecting the first transition corresponding to a decrease in the voltage of the victim word line; and
detecting the second transition corresponding to a decrease in the voltage of the word line of the plurality.

17. The method of claim 11, further comprising:
storing an indication of the determination in a register of the memory device.

18. A system, comprising:
a host device; and
a memory device coupled with the host device, the memory device including:
a memory array including a memory bank having a plurality of word lines; and
a comparison circuit coupled with the memory array and configured to:
detect a first signal from the memory bank, wherein the first signal is associated with a command executed at a word line of the plurality;
detect a first transition in the first signal and a second transition in a reference signal;
determine that the first transition occurs after the second transition; and
notify the host device of the determination.

19. The system of claim 18, wherein the memory device is further configured to:
store an indication of the determination in a register of the memory device; and
assert an alert pin configured to transmit a signal indicative of the determination, wherein notifying the host device is based, at least in part, on asserting the alert pin.

20. The system of claim 18, wherein the host device is further configured to:
determine whether to deactivate the memory device based, at least in part, on receiving the notification.

* * * * *